United States Patent [19]

Orlowski et al.

[11] Patent Number: 5,506,161

[45] Date of Patent: Apr. 9, 1996

[54] METHOD OF MANUFACTURING GRADED CHANNELS UNDERNEATH THE GATE ELECTRODE EXTENSIONS

[75] Inventors: Marius Orlowski, Austin, Tex.; Shih K. Cheng, Scottsdale, Ariz.

[73] Assignee: Motorola, Inc., Schaumburg, Ill.

[21] Appl. No.: 328,317

[22] Filed: Oct. 24, 1994

[51] Int. Cl.$^6$ ............................................. H01L 21/265
[52] U.S. Cl. .................... 437/44; 437/28; 437/34; 437/57; 437/58; 257/336
[58] Field of Search .................. 437/34, 44, 57, 437/58, 28; 257/69, 204, 274, 336, 338, 350, 351, 357, 369, 371

[56] References Cited

U.S. PATENT DOCUMENTS

| | | | |
|---|---|---|---|
| 4,808,544 | 2/1989 | matsui | 437/44 |
| 4,949,136 | 8/1990 | Jain . | |
| 4,968,639 | 11/1990 | Bergonzoni . | |
| 4,994,404 | 2/1991 | Sheng et al. | 437/44 |
| 5,015,595 | 5/1991 | Wollesen | 437/31 |
| 5,015,598 | 5/1991 | Verhaar | 437/44 |
| 5,108,939 | 4/1992 | Manley et al. | 437/43 |
| 5,171,705 | 12/1992 | Choy . | |
| 5,182,619 | 1/1993 | Pfiester . | |
| 5,202,276 | 4/1993 | Malhi . | |
| 5,244,823 | 9/1993 | Adan | 437/44 |
| 5,248,627 | 9/1993 | Williams . | |
| 5,254,483 | 10/1993 | Forgerson, II. et al. | 437/45 |
| 5,328,862 | 7/1994 | Guo | 437/44 |
| 5,358,879 | 10/1994 | Brady et al. | 437/44 |
| 5,420,057 | 5/1995 | Bennett et al. | 437/44 |

FOREIGN PATENT DOCUMENTS 0309647 12/1990 Japan ........................... 437/44

OTHER PUBLICATIONS

Codella, C. F. et al., "Submicron IGFET Device With Double Implanted Lightly Doped Drian/Source Structure", IBM Technical Disclosure Bulletin, vol. 26, No. 12, May 1984, pp. 6584–6586.

Primary Examiner—George Fourson
Assistant Examiner—Long Pham
Attorney, Agent, or Firm—Rennie William Dover

[57] ABSTRACT

Insulated gate semiconductor device (10) and a method of manufacturing the insulated gate semiconductor device (10). The insulated gate semiconductor device (10) includes an N-channel transistor (55) and a P-channel transistor (60). The N-channel transistor (55) has a gate electrode (22') that has a central portion (22) and gate electrode extensions (41) adjacent to the central portion (22). Likewise the P-channel transistor (60) has a gate electrode (24') that has a central portion (24) and gate electrode extensions (42) adjacent to the central portion (24). The gate electrode extensions (41, 42) are formed by filling openings (34, 36) with a gate electrode material. The openings are used for the formation of graded channel regions underneath the gate electrode extensions (41, 42).

16 Claims, 11 Drawing Sheets

METHOD OF MANUFACTURING GRADED CHANNELS UNDERNEATH THE GATE ELECTRODE EXTENSIONS

BACKGROUND OF THE INVENTION

The present invention relates, in general, to semiconductor devices, and more particularly, to insulated gate semiconductor devices.

Generally, portable communications equipment, as well as portable computers, use low voltage and low power electronic components to conserve power, weight, and size, thereby increasing their portability. In an effort to lower power consumption, the electronic components in these types of systems are designed to operate at supply voltages of less than 5 volts(V). Typically, device parameters such as drain current, threshold voltage, threshold voltage sensitivity, body effect, subthreshold leakage currents, parasitic source/drain capacitances, and source to drain punchthrough voltages limit the operation of insulated gate semiconductor devices at voltages less than 5 volts. Moreover, techniques that improve some device parameters tend to degrade other device parameters. For example, threshold voltage control and the source to drain punchthrough voltages are improved by increasing the dopant concentration between the source and drain regions of the insulated gate semiconductor devices; however, the increased dopant concentration adversely affects the drain current, the body effect, and parasitic source/drain capacitances.

One technique for providing punchthrough protection includes tailoring the dopant concentration profiles near the source and drain regions such that a lateral component of the dopant concentration profiles of these regions has a sufficient dopant concentration to prevent punchthrough while providing a low threshold voltage. Another technique is to increase the doping concentration of the substrate, i.e., the dopant well. However, these techniques typically reduce carrier mobility, thereby lowering the drain current.

Accordingly, it would be advantageous to have an insulated gate semiconductor device and a method for fabricating the insulated gate semiconductor device that improves control of the threshold voltage and increases source/drain to substrate breakdown voltages while providing higher drain current. It would be of further advantage for the method to reduce parasitic source/drain capacitances. Further, the method should be simple and capable of integration into insulated gate semiconductor device process flows.

DETAILED DESCRIPTION OF THE DRAWINGS

Generally, the present invention provides an insulated gate semiconductor device such as an insulated gate field effect transistor and a method of fabricating or forming the semiconductor device. More particularly, the method allows fabrication of insulated gate field effect transistors using a single doping step to form a source region, a drain region, and a lightly doped drain (LDD) region. Further, the source region of the insulated gate field effect transistor comprises an active portion which is shallow and an extrinsic portion which is sufficiently deep to permit formation of a source electrode without consuming the entire source region. In other words, the source region is of sufficient depth to preclude its consumption during formation of a source electrode comprising silicide. Likewise, the drain region is of sufficient depth to preclude its consumption during the formation of the drain electrode.

Insulated gate semiconductor devices fabricated in accordance with the present invention may be fabricated as symmetric devices (bilateral embodiment) or as asymmetric devices (unilateral embodiment). In the bilateral embodiment, dopant regions of a first conductivity type are adjacent to source and drain regions of a second conductivity type. In a unilateral embodiment a dopant region of the first conductivity type is adjacent a source region of the second conductivity type and a dopant region of the second conductivity type is contiguous with a drain region of the second conductivity type and serves as a lightly doped drain region.

Figure 1:
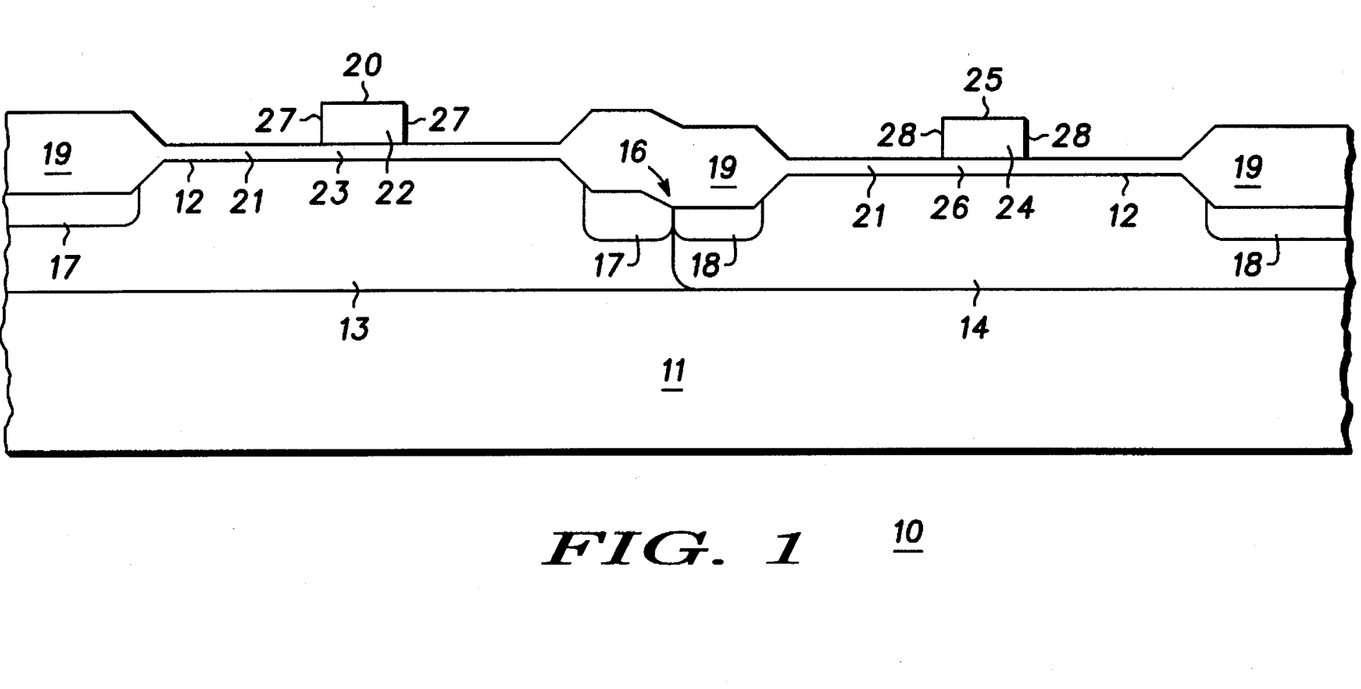
FIGS. 1–6 illustrate highly enlarged cross-sectional views of a portion of an insulated gate semiconductor device during processing in accordance with a first bilateral embodiment of the present invention.

FIG. 1 illustrates an enlarged cross-sectional view of a portion of a partially completed low power insulated gate semiconductor device 10 during processing in accordance with the present invention. What is shown in FIG. 1 is a semiconductor substrate 11 of P conductivity type having a major surface 12. Substrate 11 has, for example, a resistivity ranging between approximately 8 ohm-centimeter ($\Omega$-cm) and approximately 25 $\Omega$-cm. An impurity well 13 of P conductivity type, commonly referred to as a P-well, extends into semiconductor substrate 11 from a first portion of major surface 12 and an impurity well 14 of N conductivity type extends into substrate 11 from a second portion of major surface 12. P-well 13 laterally abuts N-well 14. By way of example, impurity wells 13 and 14 have a surface concentration ranging from approximately $1\times10^{16}$ atoms per cubic centimeter (atoms/cm$^3$) to approximately $1\times10^{18}$ atoms/cm$^3$. Methods for forming impurity wells 13 and 14 are commonly referred to as self-aligned twin well processes and typically result in the formation of bird's beaks 16. Twin well processes and bird's beak formation are well known to those skilled in the art. Dopant regions 17 are formed in P-well 13, dopant regions 18 are formed in N-well 14, and field oxide regions 19 are formed on wells 13 and 14. Dopant regions 17 and 18 prevent inversion under field oxide regions 19 and provide isolation punchthrough protection.

Still referring to FIG. 1 and using techniques well known to those skilled in the art, a layer of dielectric material 21 is formed on major surface 12. By way of example, layer of dielectric material 21 is oxide having a thickness ranging between approximately 50 angstroms and approximately 150 angstroms. Preferably, layer of oxide 21 has a thickness of approximately 100 angstroms. A gate electrode 22 having sidewalls 27 and a top surface 20 is formed on a portion 23 of layer of dielectric material 21. In addition, a gate electrode 24 having sidewalls 28 and a top surface 25 is formed on a portion 26 of layer of dielectric material 21. It should be understood that formation of dopant regions 17 and 18, field oxide regions 19, layer of dielectric material 21, and gate electrodes 22 and 24 are well known to those skilled in the art.

Figure 2:
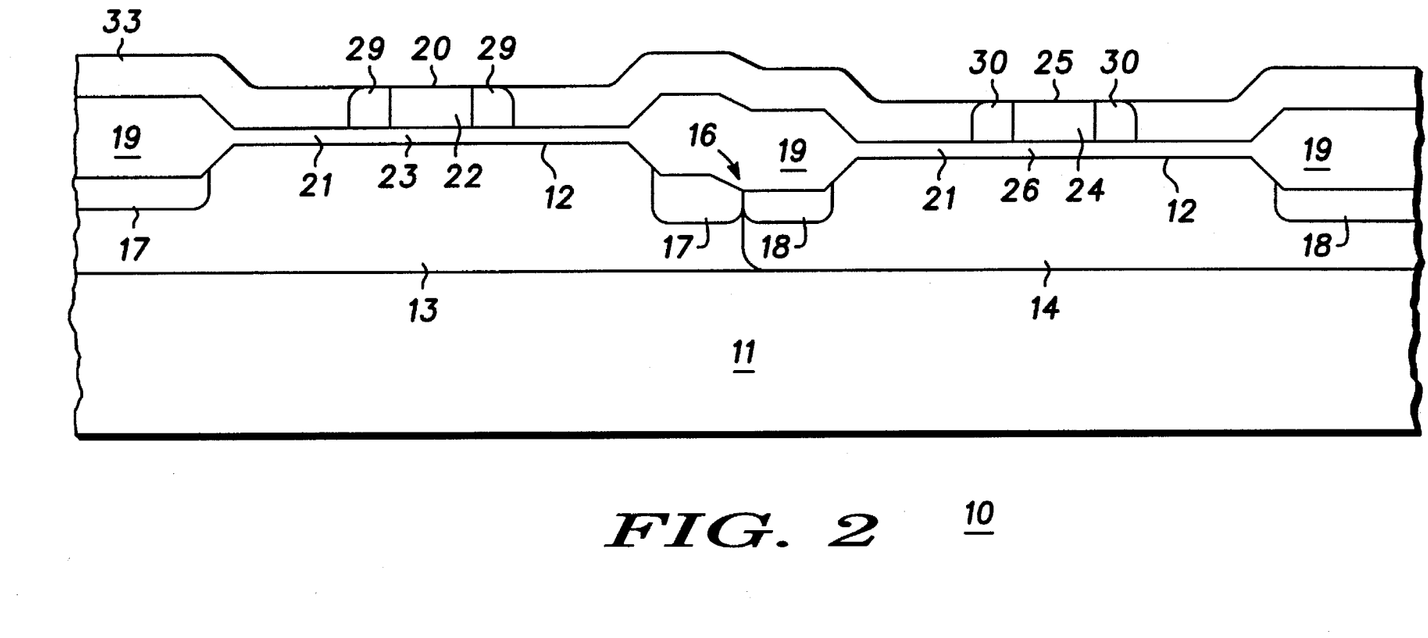

Now referring to FIG. 2, spacers 29 and 30 are formed adjacent sidewalls 27 and 28, respectively, using techniques well known to those skilled in the art. It should be understood that the same reference numerals are used in the figures to denote the same elements. It should be further understood that the material for spacers 29 and 30 is selected in accordance with the material for layer of dielectric material 21. More particularly, the material of dielectric material 21 serves as an etch-stop material during the formation of spacers 29 and 30. Thus, it is desirable that the material for spacers 29 and 30 have a different etch rate for a given etching species than the material of layer of dielectric material 21. By way of example, for layer of dielectric material 21 being oxide, suitable materials for spacers 29 and 30 include nitride, silicon germanium, and the like.

An etch-mask layer 33 is formed on layer of dielectric material 21, field oxide regions 19, gate electrodes 22 and 24, and spacers 29 and 30. Etch-mask layer 33 may be, for example, oxide formed by well known processes such as a tetraethylorthosilicate (TEOS) deposition process. Portions of etch-mask layer 33 are removed by etching to expose spacers 29 and 30. Methods for etching portions of etch-mask layer 33 are well known to those skilled in the art and include, for example, reactive ion etching (RIE) or wet etching techniques. It should be understood that the method for exposing spacers 29 and 30 is not limited to etching etch-mask layer 33; for example, spacers 29 and 30 may be exposed by using chem-mechanical polishing to remove portions of etch-mask layer 33, thereby exposing spacers 29 and 30.

Figure 3:
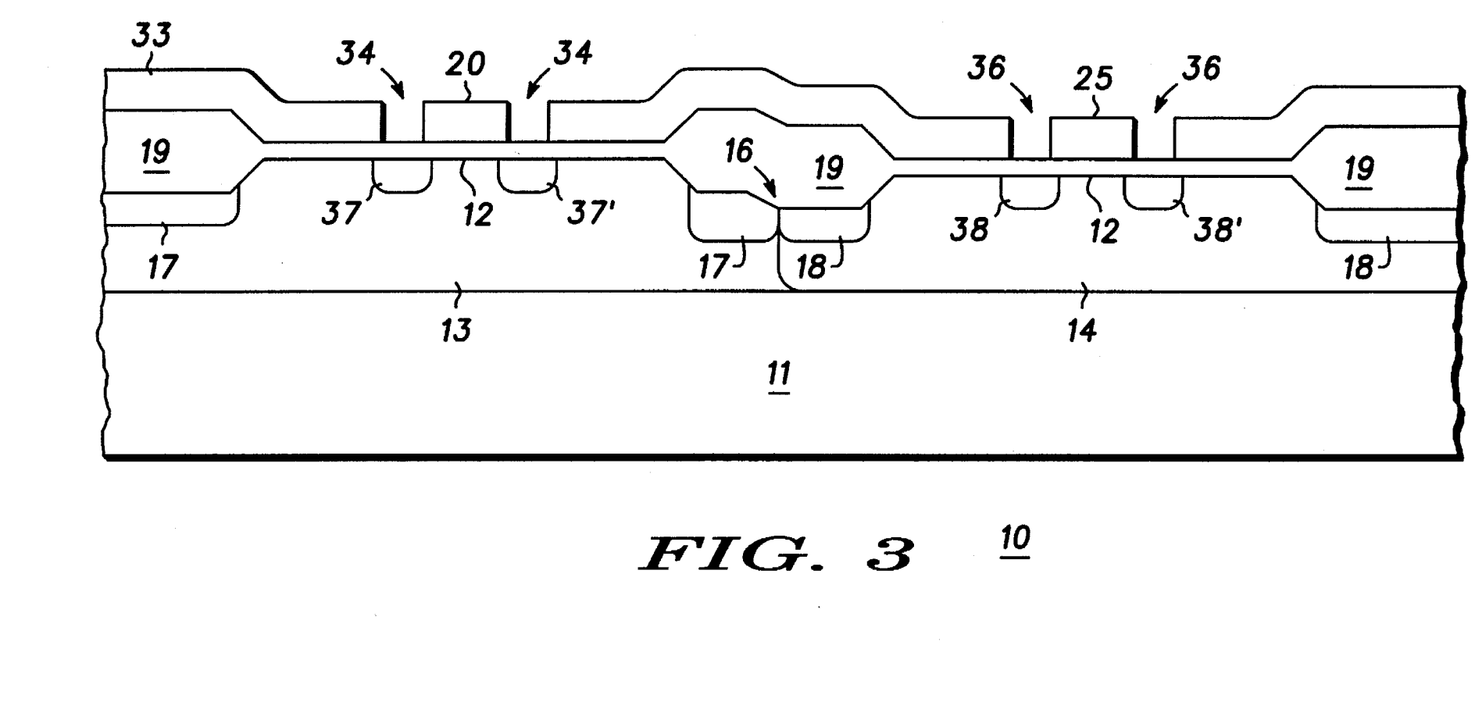

Now referring to FIG. 3, spacers 29 and 30 are removed to expose portions of layer of dielectric material 21. In particular, removal of spacers 29 and 30 forms openings 34 and 36, respectively, and exposes portions of gate oxide 23 and 26, respectively. By way of example, openings 34 and 36 are formed by anisotropically etching spacers 29 and 30, respectively, using an RIE etch.

An implant block mask (not shown) of, for example, photoresist is formed on the remaining portions of etch-mask layer 33 and fills openings 34 and 36. Openings 34 are reopened by patterning the photoresist and removing the photoresist filling openings 34. Techniques for forming, patterning, and removing portions of the photoresist are well known to those skilled in the art. An impurity material of P conductivity type such as, for example, boron is implanted through openings 34 into P-well 13 to form dopant regions 37 and 37'. By way of example, dopant regions 37 and 37' have a concentration ranging from approximately $1\times10^{16}$ atoms/cm$^3$ to approximately $5\times10^{17}$ atoms/cm$^3$, and vertically extend approximately 0.1 μm to 0.3 μm into P-well 13 from major surface 12. Suitable implant parameters for forming dopant regions 37 and 37' include an implant dose ranging between approximately $1\times10^{12}$ atoms/cm$^2$ and approximately $1\times10^{14}$ atoms/cm$^2$ and an implant energy ranging between approximately 20 kilo electron volts (KEV) and approximately 60 KeV.

The implant block mask, i.e., photoresist, is removed and another implant block mask of, for example, photoresist is formed on the remaining portions of etch-mask layer 33 and fills openings 34 and 36. Openings 36 are reopened by patterning the photoresist and removing the photoresist filling openings 36. An impurity material of N conductivity type such as, for example, phosphorus, is implanted through openings 36 into N-well 14 to form dopant regions 38 and 38'. By way of example, dopant regions 38 and 38' have a concentration ranging from approximately $1\times10^{16}$ atoms/cm$^3$ to approximately $5\times10^{17}$ atoms/cm$^3$, and vertically extend approximately 0.1 μm to 0.3 μm into N-well 14 from major surface 12. Suitable implant parameters for forming dopant regions 38 and 38' include an implant dose ranging between approximately $1\times10^{12}$ atoms/cm$^2$ and approximately $1\times10^{14}$ atoms/cm$^2$ and an implant energy ranging between approximately 40 kilo electron volts (KeV) and approximately 100 KeV. The implant block mask, i.e., the photoresist filling openings 37 and 37' and covering etch-mask layer 33, is removed.

It should be understood that in accordance with bilateral embodiments of the present invention, dopant regions 37 and 37' are of the same conductivity type and dopant regions 38 and 38' are of the same conductivity type. However, in accordance with unilateral embodiments of the present invention described with reference to FIGS. 8 and 9, dopant regions 37 and 38' are of a first conductivity type and dopant regions 37' and 38 are of a second conductivity type. Techniques for fabricating insulated gate field effect transistors having dopant regions 37 and 38' of the first conductivity type and dopant regions 37' and 38 of the second conductivity type are well known to those skilled in the art.

Figure 4:
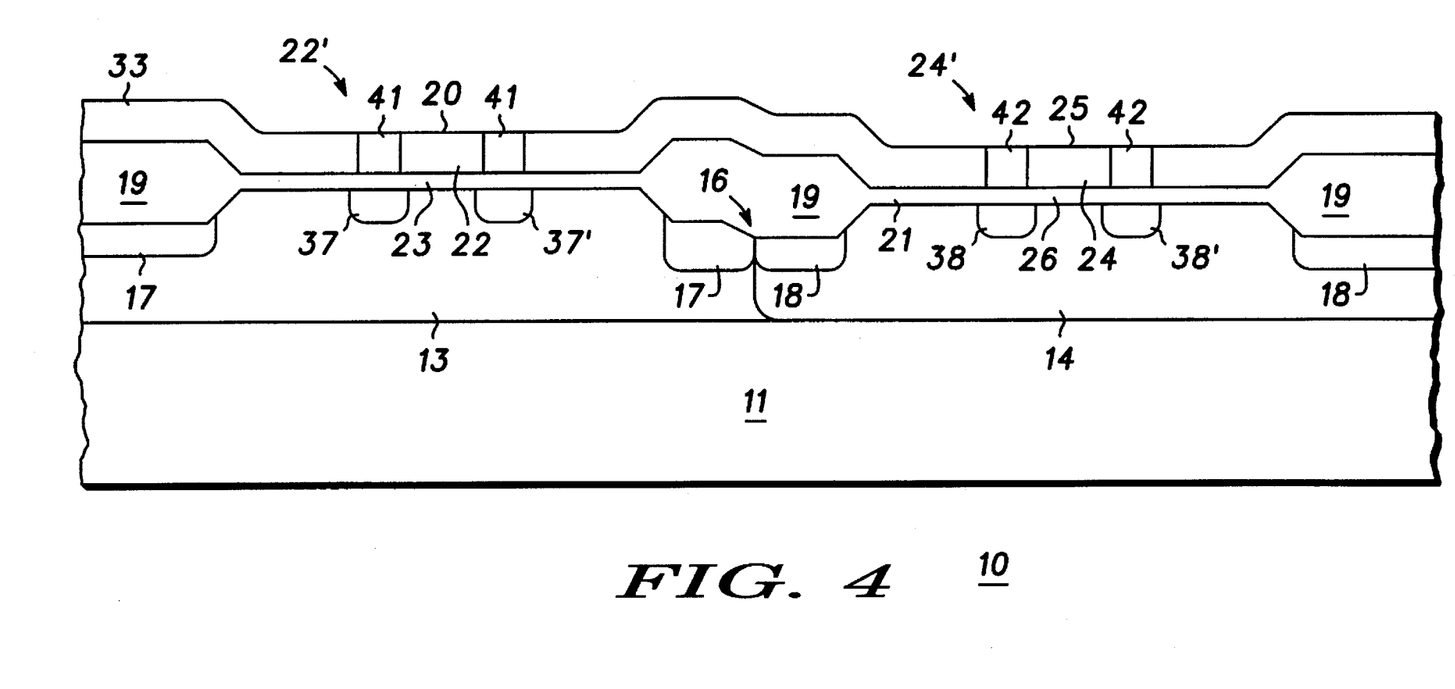

Now referring to FIG. 4, a layer of polysilicon (not shown) is formed on etch-mask layer 33 and fills openings 34 and 36. The layer of polysilicon is etched using techniques well known to those skilled in the art so that the polysilicon filling openings 34 and 36 (shown in FIG. 3) is coplanar with top surfaces 20 and 25. Thus, polysilicon plugs 41 and 42 fill openings 34 and 36, respectively, and serve as extensions to the respective gate electrodes 22 and 24. It should be noted that gate electrode 22 and gate extensions 41 cooperate to form gate electrode 22' and gate electrode 24 cooperates with extensions 42 to form gate electrode 24'. In addition, polysilicon plugs 41 and 42 serve as an implant block mask and an alignment aid for implant steps described with reference to FIGS. 5, 7, and 10. Techniques for forming layers of polysilicon are well known to those skilled in the art. Although polysilicon plugs are formed using undoped polysilicon, it should be noted that polysilicon plugs may be formed using doped or undoped polysilicon.

Figure 5:
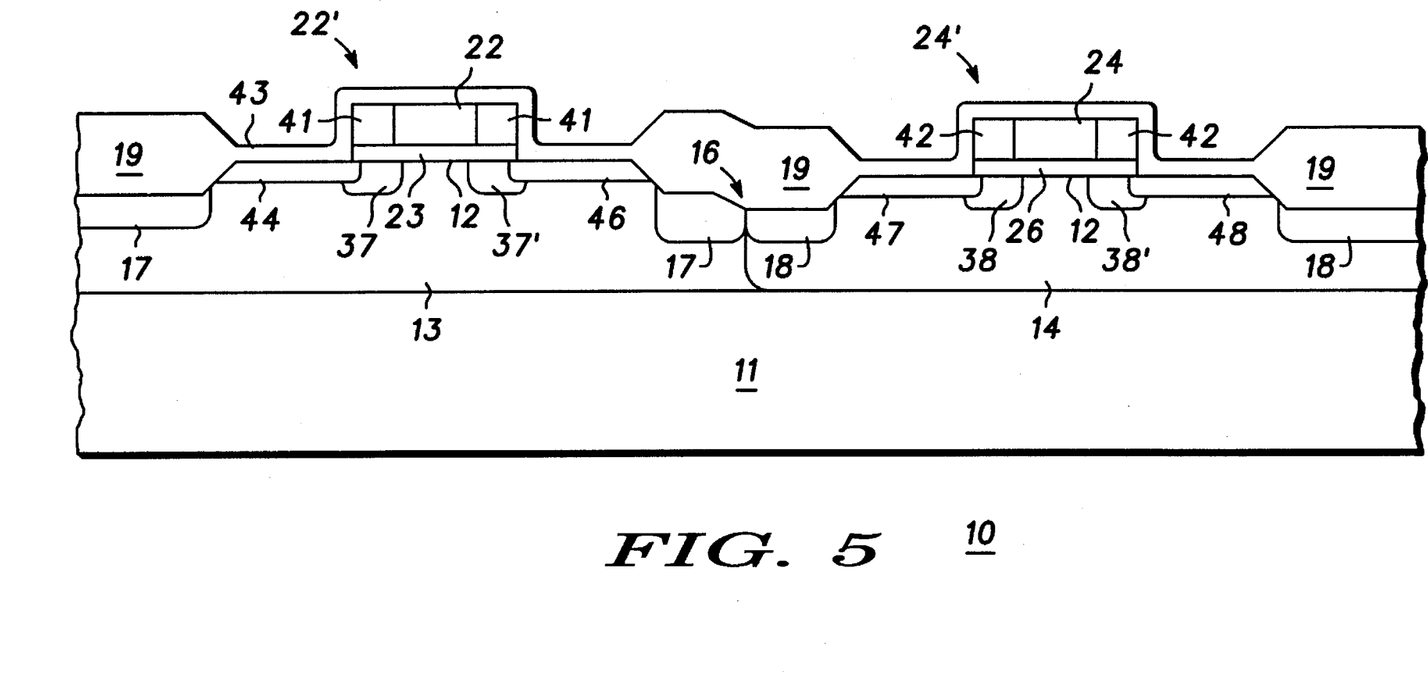

Now referring to FIG. 5 and using techniques well known to those skilled in the art, etch-mask layer 33 is removed from surface 12. It should be noted that portions of field oxide regions 19 are also removed. An implant protect mask 43 is formed on surface 12, gate electrode 22', i.e., gate electrode 22 and gate extensions 41, gate electrode 24', i.e., gate electrode 24 and gate extensions 42, sidewalls of gate extensions 41 and 42, and portions of field oxide 19. By way of example, implant protect mask 43 is oxide having a thickness ranging between approximately 1,000 angstroms and approximately 4,000 angstroms. It should be understood by those skilled in the art that implant protect mask 43 protects surface 12 from damage by implant steps described infra and prevents gate electrode extensions 41 and 42 from becoming shorted with the respective source and drain regions 44, 46, 47, and 48 described with reference to FIG. 6. It should be noted that although portions of implant protect mask 43 are on field oxide regions 19, regions 19 are shown as a single layer to simplify the figures and the description. An implant block mask (not shown) of, for example, photoresist is formed on implant protect mask 43. The photoresist is patterned to form windows which expose portions of implant block mask 43 adjacent edges of gate electrode extensions 41 and covering P-well 13.

A source region 44 and a drain region 46 are formed in the portions of P-well 13 adjacent gate electrode extensions 41. More particularly, an impurity material of N conductivity type such as, for example, arsenic is implanted through the windows patterned in the photoresist and into the portions of P-well 13. Source region 44 is aligned to an edge of one gate electrode extension 41 and drain region 46 is aligned to an edge of another gate electrode extension 41 of gate electrode 22'. By way of example, source region 44 and drain region 46 extend vertically from major surface 12 into the respective portions of P-well 13 a distance of approximately 0.15 μm to 0.35 μm. Preferably, dopant regions 37 and 37' extend vertically further into P-well 13 than source and drain regions 44 and 46. The patterned layer of photoresist is removed.

Another implant block mask (not shown) of, for example, photoresist is formed on implant protect mask 43. The photoresist is patterned to form windows which expose portions of implant block mask 43 adjacent edges of gate electrode extensions 42 and covering N-well 14. A source region 47 and a drain region 48 are formed in the portions of N-well 14 adjacent gate electrode extensions 42. More particularly, an impurity material of P conductivity type such as, for example, $BF_2$ is implanted through the windows patterned in the photoresist and into the portions of the N-well 14. Source region 47 is aligned to an edge of one gate electrode extension 42 and drain region 48 is aligned to an edge of another gate electrode extension 42 of gate electrode 24'. By way of example, source region 47 and drain region 48 extend vertically from major surface 12 into the respective portions of N-well 14 a distance of approximately 0.15 μm to 0.35 μm. Preferably, dopant regions 38 and 38' extend vertically further into N-well 14 than source and-drain regions 47 and 48, respectively. The patterned layer of photoresist is removed.

Figure 6:
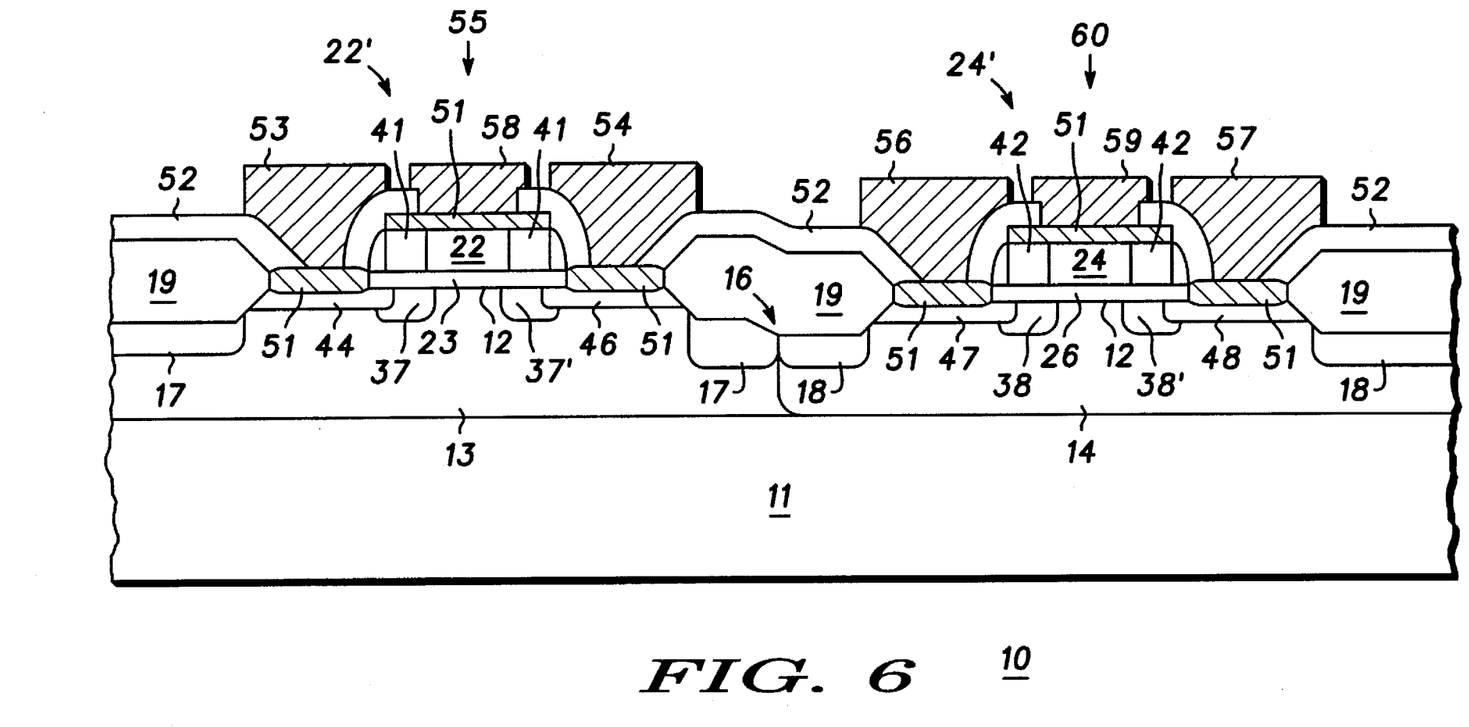

Now referring to FIG. 6, openings (not shown) are formed in implant protect mask 43. More particularly, the openings expose surface 12 of source and drain regions 44 and 46, respectively, surface 12 of source and drain regions 47 and 48, respectively, gate electrode 22' and gate electrode 24'. Using techniques well known to those skilled in the art, silicide 51 is formed on the exposed portions of surface 12 and the exposed portions of gate electrodes 22' and 24'. A conformal layer of dielectric material 52 is formed on insulated gate field effect transistor 10, wherein layer of dielectric material 52 covers silicide 51 and field oxide regions 19. A plurality of openings (not shown) are formed in layer of dielectric material 52 to expose portions of silicide 51 in source region 44, drain region 46, gate electrode 22', source region 47, drain region 48, and gate electrode 24'. Source and drain electrodes 53 and 54, respectively, are formed to contact silicide 51 on the respective source and drain regions 44 and 46. Further, source and drain electrodes 56 and 57, respectively, are formed to contact silicide 51 on the respective source and drain regions 47 and 48. Gate contacts 58 and 59 are formed to contact silicide 51 on gate electrodes 22' and 24'. Methods for forming electrodes and contacts to silicided regions are well known to those skilled in the art.

It should be noted that insulated gate semiconductor device 10 is a complementary field effect device comprising an N-channel transistor 55 and a P-channel transistor 60. In other words, an N-channel transistor 55 is formed in P-well 13 and a P-channel transistor 60 is formed in N-well 14. However, the present invention is not limited to complementary devices; for example, an N-channel field effect transistor may be fabricated in a substrate of P conductivity type or a P-channel field effect transistor may be fabricated in a substrate of N conductivity type.

Figure 7:
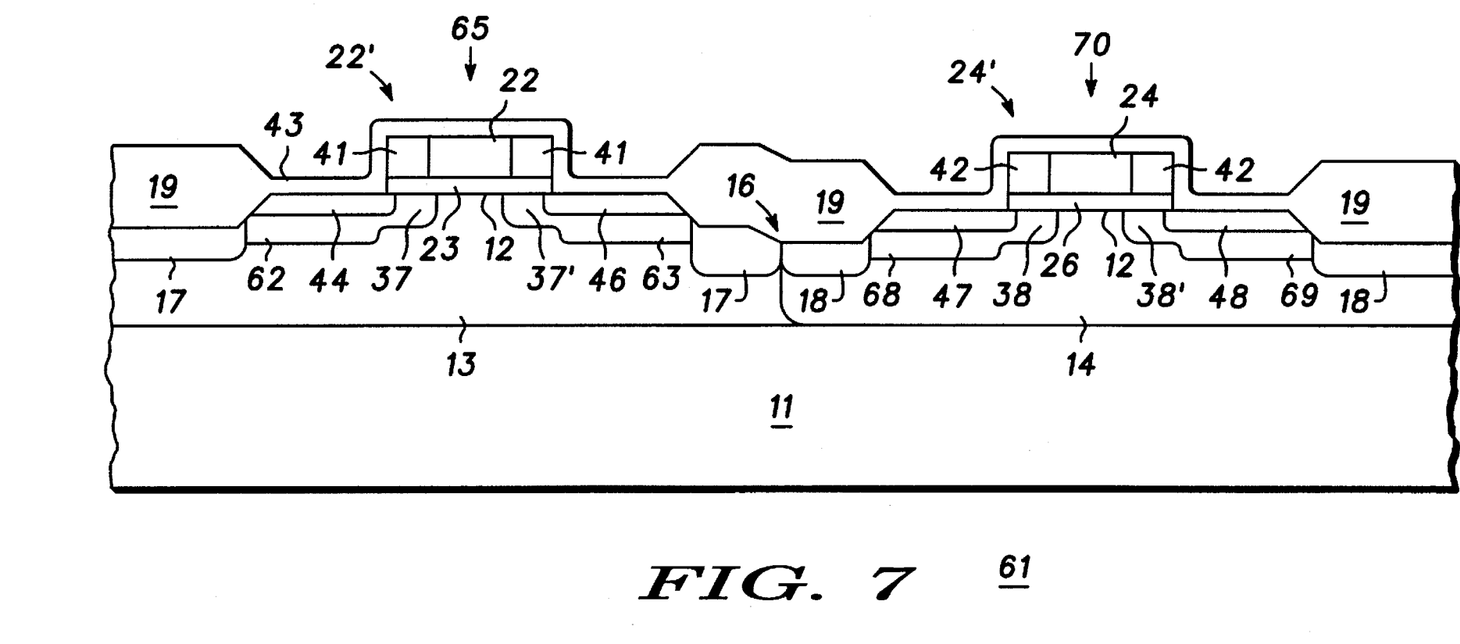
FIGS. 7–8 illustrate highly enlarged cross-sectional views of a portion of an insulated gate semiconductor device during processing in accordance with a second bilateral embodiment of the present invention.

FIG. 7 illustrates a cross-sectional view of an insulated gate semiconductor device 61 comprising an N-channel transistor 65 and a P-channel transistor 70 in accordance with a second bilateral embodiment of the present invention. It should be understood that FIGS. 1–4 are common to insulated gate field effect transistors 10 and 61, i.e., common to the first and second bilateral embodiments of the present invention. Accordingly, FIG. 7 illustrates a cross-sectional view of the portion of the insulated gate field effect transistor shown in FIG. 4 further along in processing. Using techniques well known in the art, etch-mask layer 33 is removed from surface 12. It should be noted that portions of field oxide regions 19 are also removed.

An implant protect mask 43 is formed on surface 12, gate electrode 22', i.e., gate electrode 22 and gate extensions 41, gate electrode 24', i.e., gate electrode 24 and gate extensions 42, the sidewalls of gate extensions 41 and 42, and portions of field oxide 19. By way of example implant protect mask 43 is oxide having a thickness ranging between approximately 1,000 angstroms and approximately 4,000 angstroms. It should be noted that although portions of implant protect mask 43 are on field oxide regions 19, regions 19 are shown as a single layer to simplify the figures and the description. An implant block mask (not shown) of, for example, photoresist is formed on implant protect mask 43. The photoresist is patterned to form windows which expose portions of implant block mask 43 adjacent edges of gate electrode extensions 41 and covering P-well 13.

An impurity material of P conductivity type such as, for example, boron is implanted through the windows patterned in the photoresist and into portions of P-well 13; thereby forming halo regions 62 and 63. Halo region 62 is aligned to an edge of one gate electrode extension 41 and halo region 63 is aligned to an edge of the other gate electrode extension 41 of gate electrode 22'. By way of example, halo regions 62 and 63 extend vertically from major surface 12 into the respective portions of P-well 13 a distance of approximately 0.2 μm to 0.4 μm. Preferably, halo regions 62 and 63 extend vertically further into P-well 13 than dopant regions 37 and 37'.

A source region 44 and a drain region 46 are formed in the portions of P-well 13 adjacent gate electrode extensions 41. More particularly, an impurity material of N conductivity type such as, for example, arsenic is implanted through the windows patterned in the photoresist and into the portions of P-well 13. Source region 44 is aligned to an edge of one gate electrode extension 41 and drain region 46 is aligned to an edge of the other gate electrode extension 41 of gate electrode 22. By way of example, source region 44 and drain region 46 extend vertically from major surface 12 into the respective portions of P-well 13 a distance of approximately 0.15 μm to 0.35 μm. Preferably, dopant regions 62 and 63 extend vertically further into P-well 13 than source and drain regions 44 and 46. The patterned layer of photoresist is removed.

Another implant block mask (not shown) of, for example, photoresist is formed on implant protect mask 43. The photoresist is patterned to form windows which expose portions of implant block mask 43 adjacent the edges of gate electrode extensions 42 and covering N-well 14. Halo regions 68 and 69 are formed in the portions of the N-well 14 adjacent gate electrode extensions 42. More particularly, an impurity material of N conductivity type such as, for example, phosphorus is implanted through the windows patterned in the photoresist and into the portions of N-well 14. Halo region 68 is aligned to an edge of one gate electrode extension 42 and halo region 69 is aligned to an edge of the other gate electrode extension 42 of gate electrode 24'. By way of example, halo regions 68 and 69 extend vertically from major surface 12 into the respective portions of N-well 14 a distance of approximately 0.2 μm to 0.4 μm. Preferably, halo regions 68 and 69 extend vertically further into N-well 14 than dopant regions 38 and 38'.

Still referring to FIG. 7, a source region 47 and a drain region 48 are formed in the portions of N-well 14 adjacent gate electrode extensions 42. More particularly, an impurity material of P conductivity type such as, for example, $BF_2$ is implanted through the windows patterned in the photoresist and into the portions of the N-well 14. Source region 47 is aligned to an edge of one gate electrode extension 42 and drain region 48 is aligned to an edge of the other gate electrode extension 42 of gate electrode 24'. By way of example, source region 47 and drain region 48 extend vertically from major surface 12 into the respective portions of N-well 14 a distance of approximately 0.15 μm to 0.35 μm. Preferably, dopant regions 68 and 69 extend vertically further into N-well 14 than source and drain regions 47 and 48, respectively. The patterned layer of photoresist is removed.

Figure 8:
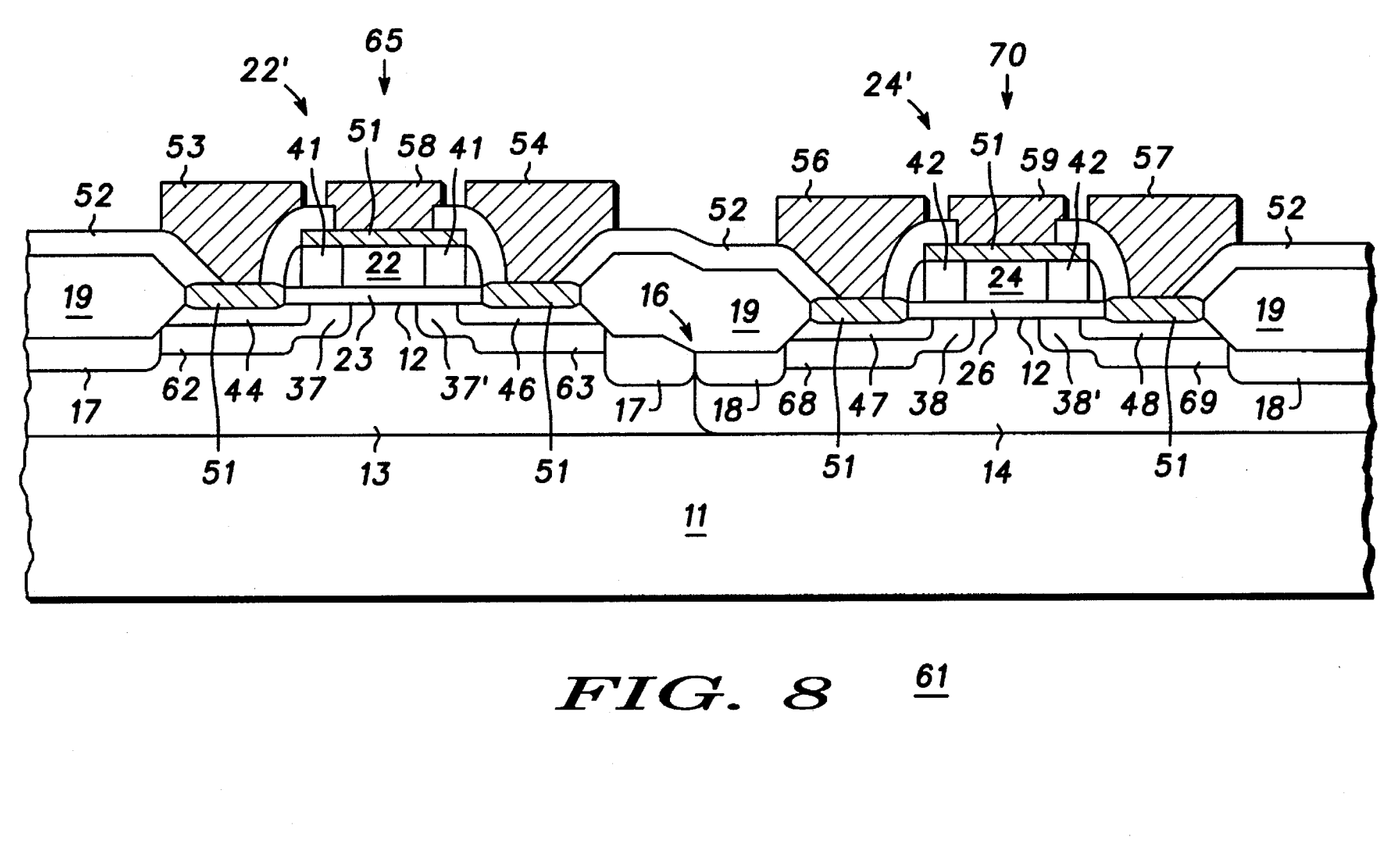

Now referring to FIG. 8, openings (not shown) are formed in implant protect mask 43. More particularly, the openings expose surface 12 of source and drain regions 44 and 46, respectively, surface 12 of source and drain regions 47 and 48, respectively, gate electrode 22' and gate electrode 24'. Using techniques well known to those skilled in the art, silicide 51 is formed on the exposed portions of surface 12 and the exposed portions of gate electrodes 22' and 24'. A conformal layer of dielectric material 52 is formed on insulated gate field effect transistor 61, wherein layer of dielectric material 52 covers silicide 51 and field oxide regions 19. A plurality of openings (not shown) are formed in layer of dielectric material 52 to expose portions of silicide 51 in source region 44, drain region 46, gate electrode 22', source region 47, drain region 48, and gate electrode 24'. Source and drain electrodes 53 and 54, respectively, are formed to contact the silicide 51 on the respective source and drain regions 44 and 46. Further, source and drain electrodes 56 and 57, respectively, are formed to contact the silicide 51 on the respective source and drain regions 47 and 48. Gate contacts 58 and 59 are formed to contact the silicide 51 on gate electrodes 22' and 24'. Methods for forming electrodes and contacts to silicided regions are well known to those skilled in the art.

Figure 9:
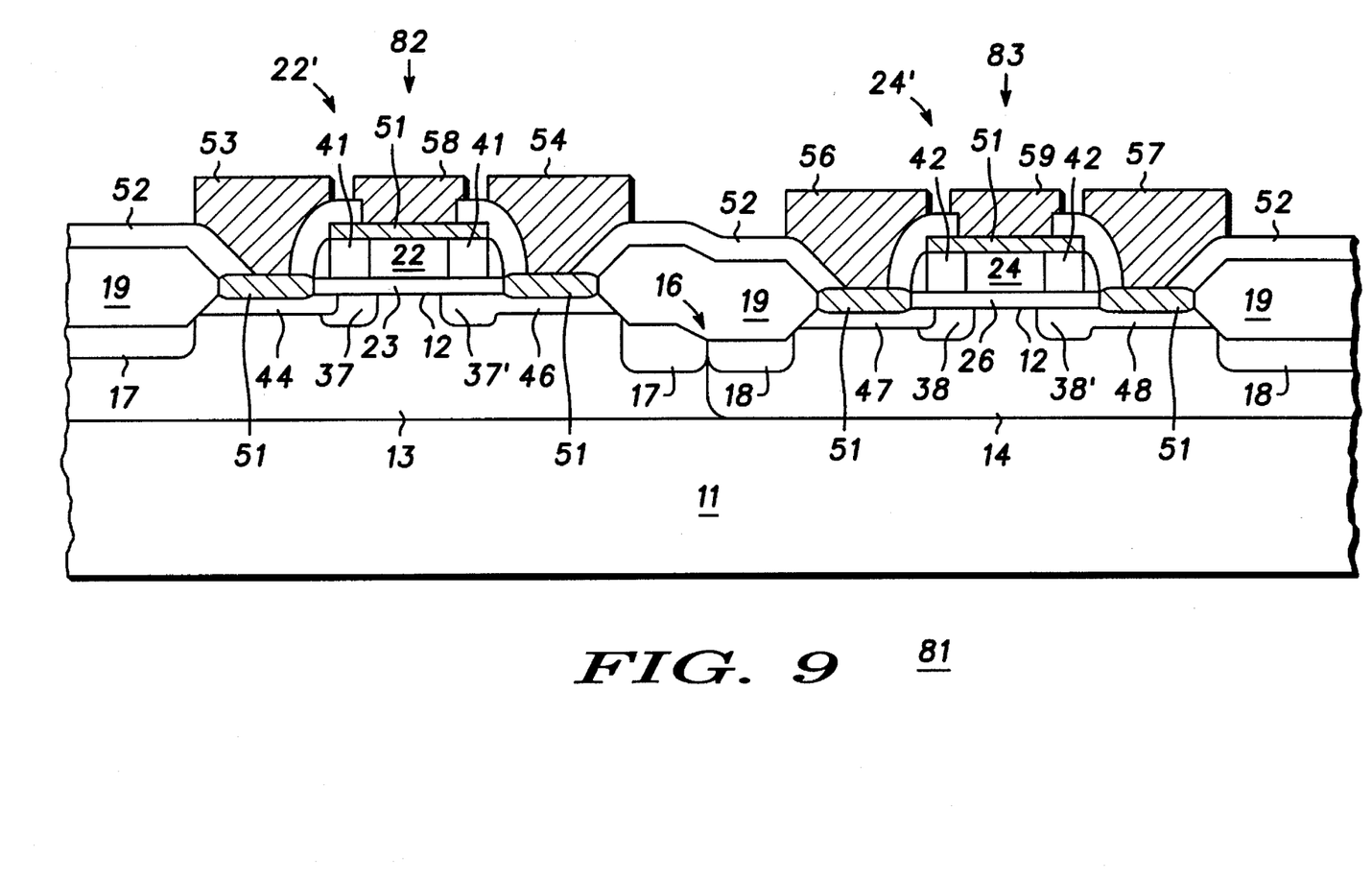
FIG. 9 illustrates a highly enlarged cross-sectional view of a portion of an insulated gate semiconductor device in accordance with a first unilateral embodiment of the present invention.

FIG. 9 illustrates a cross-sectional view of a portion of an insulated gate semiconductor device 81 during processing in accordance with a first unilateral embodiment of the present invention. It should be understood that FIGS. 1–5 and the descriptions pertaining thereto are common to insulated gate semiconductor devices 10 and 81, i.e., common to the first bilateral embodiment and the first unilateral embodiment of the present invention. However, in accordance with the first unilateral embodiment of the present invention, dopant regions 37 and 38' are of P conductivity type and dopant regions 37' and 38 are of N conductivity type. Thus, it should be noted that the difference between insulated gate semiconductor device 10 of FIG. 6 and insulated gate semiconductor device 81 of FIG. 9 is the conductivity type of dopant regions 37' and 38'. In particular, dopant regions 37' and 38' of FIG. 6 are of P conductivity type, whereas dopant regions 37' and 38' of FIG. 9 are of N conductivity type. Dopant regions 37' and 38' of FIG. 9 serve as lightly doped drain portions of drain regions 46 and 48, respectively.

Accordingly, insulated gate semiconductor device 81 of FIG. 9 is a complementary insulated gate semiconductor device having an N-channel transistor 82 and a P-channel transistor 83. P-channel transistor 82 includes a source region 44, a drain region 46, and a gate electrode 22'. Silicide 51 is formed on surface 12 of source and drain regions 44 and 46, respectively. Conformal layer of dielectric material 52 covers silicide 51 and field oxide regions 19. Openings are formed in layer of dielectric material 52 and source and drain electrodes 53 and 54, respectively, are formed through the openings to contact silicide 51 on the respective source and drain regions 44 and 46. In addition, a gate contact 58 is formed to contact silicide 51 on gate electrode 22'. Similarly, N-channel transistor 83 includes a source region 47, a drain region 48, and a gate electrode 24'. Silicide 51 is formed on surface 12 of source and drain regions 47 and 48, respectively. Openings are formed in layer of dielectric material 52 and source and drain electrodes 56 and 57, respectively, are formed to contact the silicide 51 on the respective source and drain regions 47 and 48. Gate electrode 59 is formed to contact silicide 51 on gate electrode 24'.

Figure 10:
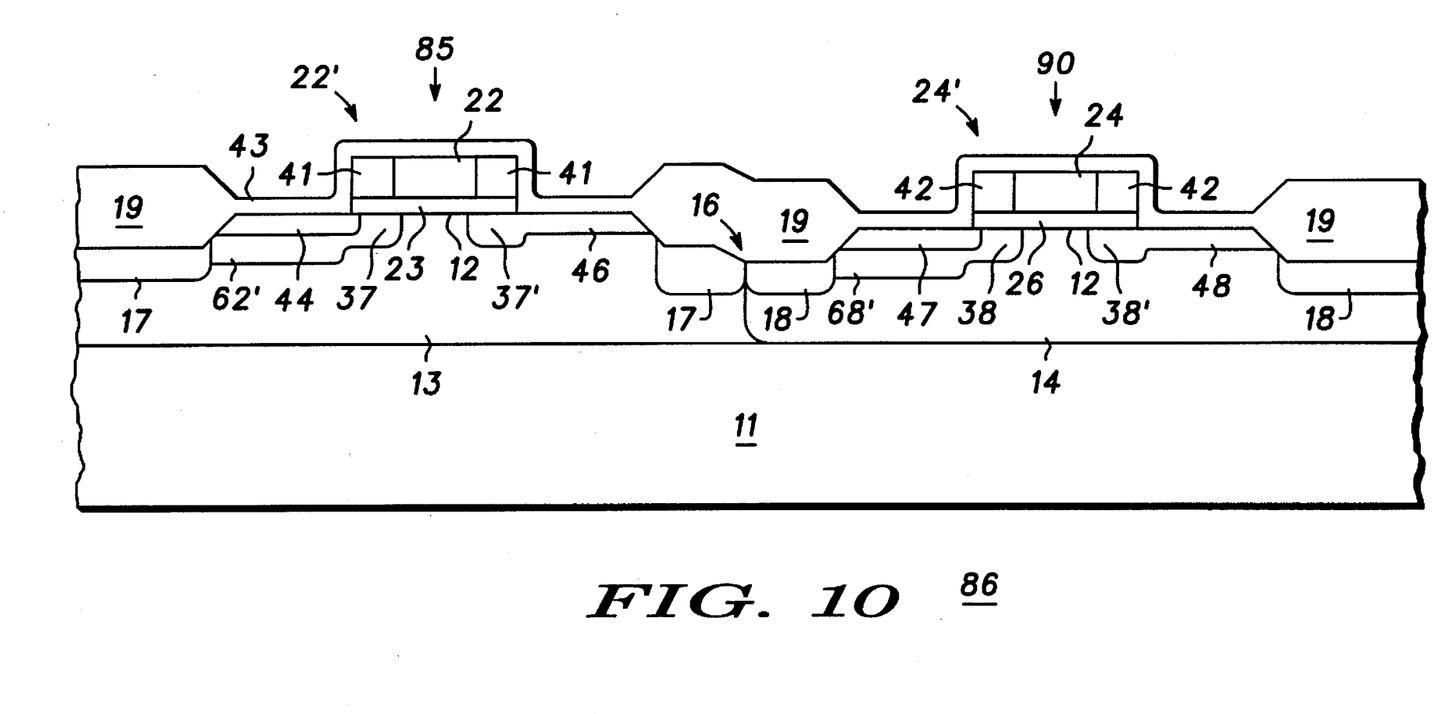
FIGS. 10–11 illustrate highly enlarged cross-sectional views of an insulated gate semiconductor device during processing in accordance with a second unilateral embodiment of the present invention.

FIG. 10 illustrates a cross-sectional view of an insulated gate semiconductor device 86 in accordance with a second unilateral embodiment of the present invention. Semiconductor device 86 comprises an N-channel transistor 85 and a P-channel transistor 90. It should be understood that FIGS. 1–4 are common to insulated gate semiconductor devices 81 and 86, i.e., common to the first and second unilateral embodiments of the present invention. Thus, dopant regions 37 and 38' are of P conductivity type and dopant regions 37' and 38 are of N conductivity type. Accordingly, FIG. 10 illustrates a cross-sectional view of the portion of the insulated gate semiconductor device shown in FIG. 4 further along in processing. Using techniques well known to those skilled in the art, etch-mask layer 33 is removed from surface 12. It should be noted that portions of field oxide regions 19 are also removed.

An implant protect mask 43 is formed on surface 12, gate electrode 22', i.e., gate electrode 22, and gate extensions 41, gate electrode 24', i.e., gate electrode 24 and gate extensions 42, sidewalls of gate extensions 41 and 42, and portions of field oxide 19. By way of example implant protect mask 43 is oxide having a thickness ranging between approximately 1,000 angstroms and approximately 4,000 angstroms. It should be understood by those skilled in the art that implant protect mask 43 protects surface 12 from damage by implant steps described infra and prevents extensions 41 and 42 from becoming shorted with the respective source and drain regions 44, 46, 47, and 48 described with reference to FIG. 11. It should be noted that although portions of implant protect mask 43 are on field oxide regions 19, regions 19 are shown as a single layer to simplify the figures and the description. An implant block mask (not shown) of, for example, photoresist is formed on implant protect mask 43. The photoresist is patterned to form a window (not shown) which exposes a portion of implant block mask 43 adjacent a gate electrode extension 41 that is above dopant region 37.

An impurity material of P conductivity type such as, for example, boron is implanted through the window patterned in the photoresist and into the portion of P-well 13 adjacent dopant region 37. The impurity material of P conductivity type forms a halo region 62' that is contiguous with dopant region 37. By way of example, halo region 62' extends vertically from major surface 12 into P-well 13 a distance of approximately 0.2 μm to 0.4 μm. Preferably, halo region 62' extends vertically further into P-well 13 than dopant region 37. The photoresist is removed and another implant block mask (not shown) such as, for example, photoresist is formed on implant mask 43. The photoresist is patterned to form a window which exposes a portion of implant block mask 43 adjacent a gate electrode extension 42 that is above dopant region 38. An impurity material of N conductivity type such as, for example, arsenic is implanted through the window patterned in the photoresist and into the portion of N-well 14 adjacent dopant region 38. The impurity material of N conductivity type forms a halo region 68' that is contiguous with dopant region 38. By way of example, halo region 68' extends vertically from major surface 12 into N-well 14 a distance of approximately 0.15 μm to 0.35 μm. Preferably, halo region 68' extends vertically further into N-well 14 than dopant region 38. Another implant block mask (not shown) of, for example, photoresist is formed on implant protect mask 43. The photoresist is patterned to form windows which expose portions of implant block mask 43 adjacent edges of gate electrode extensions 41 and covering P-well 13.

A source region 44 and a drain region 46 are formed in the portions of P-well 13 adjacent gate electrode extensions 41. More particularly, an impurity material of N conductivity type such as, for example, arsenic is implanted through the windows patterned in the photoresist and into the portions of the P-well 13. Source region 44 is aligned to an edge of a first gate electrode extension 41 and drain region 46 is aligned to an edge of a second gate electrode extension 41 of gate electrode 22'. By way of example, source region 44 and drain region 46 extend vertically from major surface 12 into the respective portions of P-well 13 a distance of approximately 0.2 μm to 0.4 μm. Preferably, dopant regions 37 and 37' extend vertically further into P-well 13 than source and drain regions 44 and 46. The patterned layer of photoresist is removed.

Another implant block mask (not shown) of, for example, photoresist is formed on implant protect mask 43. The photoresist is patterned to form windows which expose portions of implant block mask 43 adjacent edges of gate electrode extensions 42 and covering N-well 14. A source region 47 and a drain region 48 are formed in the portions of N-well 14 adjacent gate electrode extensions 42. More particularly, an impurity material of P conductivity type such as, for example, boron is implanted through the windows patterned in the photoresist and into portions of N-well 14. Source region 47 is aligned to an edge of a first gate electrode extension 42 and drain region 48 is aligned to an edge of a second gate electrode extension 42 of gate electrode 24'. By way of example, source region 47 and drain region 48 extend vertically from major surface 12 into the respective portions of N-well 14 a distance of approximately 0.15 μm to 0.35 μm. Preferably, dopant regions 38 and 38' extend vertically further into N-well 14 than source and drain regions 47 and 48, respectively. The patterned layer of photoresist is removed.

Figure 11:
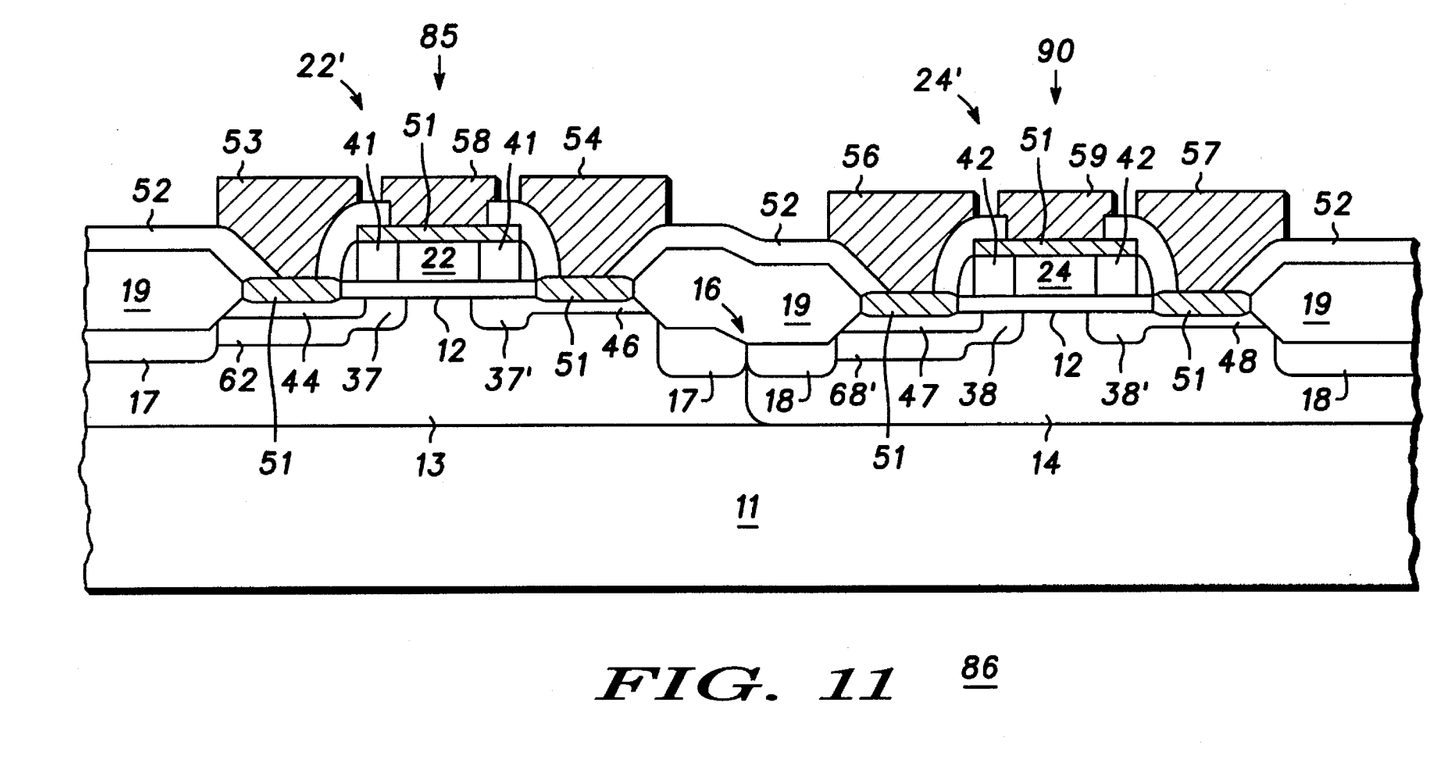

Now referring to FIG. 11, openings (not shown) are formed in implant protect mask 43. More particularly, the openings expose surface 12 of source and drain regions 44 and 46, respectively, surface 12 of source and drain regions 47 and 48, respectively, gate electrode 22' and gate electrode 24'. Using techniques well known to those skilled in the art, silicide 51 is formed on the exposed portions of surface 12 and the exposed portions of gate electrodes 22' and 24'. A conformal layer of dielectric material 52 is formed on insulated gate field effect transistor 86, wherein layer of dielectric material 52 covers silicide 51 and field oxide regions 19. A plurality of openings (not shown) are formed in layer of dielectric material 52 to expose portions of silicide 51 in source region 44, drain region 46, gate electrode 22', source region 47, drain region 48, and gate electrode 24'. Source and drain electrodes 53 and 54, respectively, are formed to contact the silicide 51 on the respective source and drain regions 44 and 46. Further, source and drain electrodes 56 and 57, respectively, are formed to contact the silicide 51 on the respective source and drain regions 47 and 48. Gate contacts 58 and 59 are formed to contact the silicide 51 on gate electrodes 22' and 24'. Methods for forming electrodes and contacts to silicided regions are well known to those skilled in the art.

By now it should be appreciated that a method for forming insulated gate field effect transistors that improves control of the threshold voltage and increases source/drain to substrate breakdown voltages has been provided. An advantage of the present invention is that very shallow lightly doped source/drain extensions may be fabricated independently from the source/drain regions. Further, formation of graded channel regions may be easily included in the process.

We claim:

1. A method for fabricating an insulated gate semiconductor device, comprising the steps of:

providing a semiconductor material of a first conductivity type having a major surface;

forming a first layer of dielectric material on the major surface;

forming a portion of a first gate electrode on the layer of dielectric material, wherein the portion of the first gate electrode has first and second sidewalls;

forming a first spacer adjacent the first sidewall;

forming a second layer of dielectric material on the first layer of dielectric material, the second layer of dielectric material abutting at least the first spacer;

forming a first opening through the first spacer, wherein the first opening exposes a first portion of the first layer of dielectric material;

doping a first portion of the semiconductor material, the first portion of the semiconductor material aligned with the first opening;

forming a first gate electrode extension adjacent the first sidewall;

forming first and second dopant regions of a second conductivity type in the semiconductor material, the first dopant region proximal to the first sidewall and the second dopant region proximal to the second sidewall;

forming a first electrode on the first dopant region and a second electrode on the second dopant region; and forming a first gate conductor in contact with at least the portion of the first gate electrode.

2. The method of claim 1, further comprising the steps of:

forming a second spacer adjacent the second sidewall;

forming the second layer of dielectric material on the first layer of dielectric material, wherein the second layer of dielectric material abuts the second spacer;

forming a second opening, the second opening extending through the second spacer, wherein the second opening exposes a second portion of the first dielectric layer;

doping a second portion of the semiconductor material, the second portion of the semiconductor material aligned with the second opening; and forming a second gate electrode extension adjacent the second sidewall.

3. The method of claim 2, wherein the steps of doping a first portion and doping a second portion of the semiconductor material include doping the first and second portions of the semiconductor material with an impurity material of the first conductivity type.

4. The method of claim 2, wherein the steps of doping a first portion and doping a second portion of the semiconductor material include doping the first portion of the semiconductor material with an impurity material of the first conductivity type and doping the second portion of the semiconductor material with an impurity material of the second conductivity type.

5. The method of claim 1, wherein the step of doping a first portion of the semiconductor material includes implanting an impurity material of the first conductivity type into the semiconductor material.

6. The method of claim 1, wherein the step of forming a first gate electrode extension adjacent the first sidewall includes filling the first opening with a conductive material.

7. The method of claim 1, further including the steps of:
    forming a doped well of the second conductivity type in a third portion of the semiconductor material;
    forming a portion of a second gate electrode on a third portion of the first layer of dielectric material, wherein the portion of the second gate electrode has third and fourth sidewalls and the third portion of the first layer of dielectric material is disposed on the third portion of the semiconductor material;
    forming a third spacer adjacent the third sidewall of the portion of the second gate electrode;
    forming the second layer of dielectric material on the first layer of dielectric material, wherein the second layer of dielectric material abuts the third spacer;
    forming a third opening, wherein the third opening extends through the third spacer and exposes a third portion of the first layer of dielectric material;
    doping a fourth portion of the semiconductor material, fourth portion of the semiconductor material aligned with the third opening;
    forming a third gate electrode extension, the third gate electrode extension adjacent the third sidewall;
    forming third and fourth dopant regions in the semiconductor material, the third dopant region proximal to the third sidewall and the fourth dopant region proximal to the fourth sidewall;
    forming a third and fourth electrodes, the third electrode on the third dopant region and the fourth electrode on the fourth dopant region; and
    forming a second gate conductor, wherein the second gate conductor contacts at least the portion of the second gate electrode.

8. The method of claim 7, further comprising the steps of:
    forming a fourth spacer adjacent the fourth sidewall;
    forming the second layer of dielectric material on the first layer of dielectric material, wherein the second layer of dielectric material abuts the fourth spacer;
    forming a fourth opening, the fourth opening extending through the fourth spacer, wherein the fourth opening exposes a fourth portion of the first layer of dielectric material;
    doping a fourth portion of the semiconductor material, the fourth portion of the semiconductor material aligned with the fourth opening; and
    forming a fourth gate electrode extension, the fourth gate electrode extension adjacent the fourth sidewall.

9. The method of claim 7, wherein the steps of doping a third portion and doping a fourth portion of the semiconductor material include doping the third and fourth portions of the semiconductor material with an impurity material of the first conductivity type.

10. The method of claim 7, wherein the steps of doping a third portion and doping a fourth portion of the semiconductor material include doping the third portion of the semiconductor material with an impurity material of the first conductivity type and doping the fourth portion of the semiconductor material with an impurity material of the second conductivity type.

11. A method for manufacturing an insulated gate field effect transistor, comprising the steps of:
    providing a semiconductor substrate of a first conductivity type and having a major surface;
    forming a first layer of dielectric material on a portion of the major surface;
    forming a gate electrode on a first portion of the layer of dielectric material;
    forming a first dopant region in the semiconductor substrate aligned to a first side of the gate electrode, by forming a first spacer adjacent the first side of the gate electrode, forming a second layer of dielectric material on the first side of the gate electrode, removing the first spacer adjacent the first side of the gate electrode to form a first opening, and implanting an impurity material of the first conductivity type through the first opening and into the semiconductor substrate;
    forming a first gate electrode extension adjacent the first side of the gate electrode;
    forming second and third dopant regions in the semiconductor substrate, the second dopant region located on the first side of the gate electrode and the third dopant region located on a second side of the gate electrode;
    forming a first electrode in contact with the second dopant region;
    forming a second electrode in contact with the third dopant region; and
    forming a conductor in contact with the gate electrode.

12. The method of claim 11, further including the steps of:
    forming a fourth dopant region in the semiconductor substrate, the fourth dopant region aligned to the second side of the gate electrode; and
    forming a second gate electrode extension adjacent the second side of the gate electrode.

13. The method of claim 12, wherein the step of forming the fourth dopant region in the semiconductor substrate comprises the steps of:
    forming a second spacer adjacent the second side of the gate electrode;
    forming a second layer of dielectric material adjacent at least the second spacer;
    removing the second spacer adjacent the second side of the gate electrode to form a second opening; and
    implanting an impurity material through the second opening and into the semiconductor substrate.

14. The method of claim 13, wherein the step of implanting an impurity material through the second opening includes implanting an impurity material of the first conductivity type through the second opening.

15. The method of claim 14, further including forming fifth and sixth dopant regions of the first conductivity type in the semiconductor substrate, the fifth dopant region located on the first side of the gate electrode and the sixth dopant region located on the second side of the gate electrode, wherein the fifth dopant regions extends further into the semiconductor substrate than the first dopant region and the sixth dopant region extends further into the semiconductor substrate than the fourth dopant region.

16. The method of claim 13, wherein the step of implanting an impurity material through the second opening includes implanting an impurity material of a second conductivity type through the second opening.

* * * * *